United States Patent
Fackenthal et al.

(10) Patent No.: US 8,199,566 B1
(45) Date of Patent: Jun. 12, 2012

(54) WRITE PERFORMANCE OF PHASE CHANGE MEMORY USING SET-PULSE SHAPING

(75) Inventors: Rich Fackenthal, Carmichael, CA (US);
Nicholas Hendrickson, Rancho Cordova, CA (US); Aswin Thiruvengadam, Mather, CA (US)

(73) Assignee: Micron Technology, Inc., Boise, ID (US)

( * ) Notice: Subject to any disclaimer, the term of this patent is extended or adjusted under 35 U.S.C. 154(b) by 255 days.

(21) Appl. No.: 12/623,926

(22) Filed: Nov. 23, 2009

(51) Int. Cl.
*G11C 11/00* (2006.01)
(52) U.S. Cl. ............... 365/163; 365/148; 365/189.09
(58) Field of Classification Search .......... 365/148, 365/163, 189.09
See application file for complete search history.

(56) References Cited

U.S. PATENT DOCUMENTS

| | | | |
|---|---|---|---|
| 2005/0045864 A1* | 3/2005 | Tanaka et al. | 257/5 |
| 2006/0220071 A1* | 10/2006 | Kang et al. | 257/248 |
| 2008/0316792 A1* | 12/2008 | Philipp | 365/148 |
| 2009/0034324 A1* | 2/2009 | Kim et al. | 365/163 |
| 2009/0080242 A1* | 3/2009 | Resta et al. | 365/163 |
| 2010/0096613 A1* | 4/2010 | Morikawa et al. | 257/4 |

OTHER PUBLICATIONS

Bedeschi et al., "A Multi-Level-Cell Bipolar Selected Phase Change Memory" 22 pages.

* cited by examiner

*Primary Examiner* — Hoai V Ho
(74) *Attorney, Agent, or Firm* — Berkeley Law & Technology Group, LLP

(57) ABSTRACT

Subject matter disclosed herein relates to a memory device, and more particularly to write performance of a phase change memory.

20 Claims, 7 Drawing Sheets

WRITE PERFORMANCE OF PHASE CHANGE MEMORY USING SET-PULSE SHAPING

BACKGROUND

1. Field

Subject matter disclosed herein relates to a memory device, and more particularly to write performance of a phase change memory.

2. Information

Phase change memory (PCM) may operate based, at least in part, on behavior and properties of one or more particular phase change materials, such as chalcogenide glass and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

In a PCM memory cell, transitioning from an amorphous state to a crystalline state may involve a transition period that is short enough to provide relatively fast PCM operation while being long enough to allow such a transition from an amorphous state to a crystalline state. Accordingly, a transition period that is too short may result in a PCM memory cell comprising a mixture of material in an amorphous and a crystalline state, leading to an undefined memory cell state resulting in a failure of the P CM memory cell, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
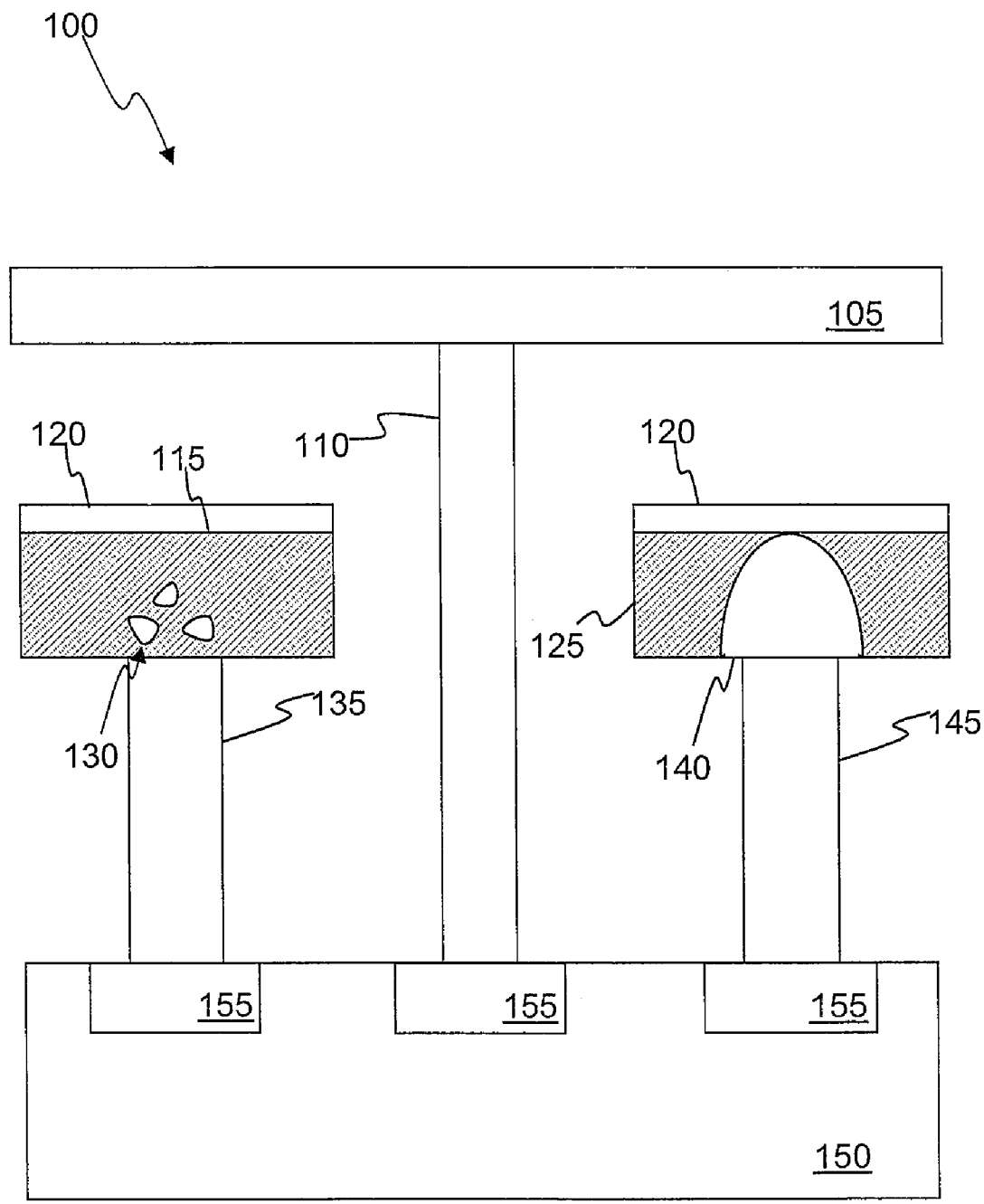
FIG. 1 is a schematic diagram of a portion of phase change memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving a ramping-down bias signal to crystallize an active volume of phase change material in a phase change memory (PCM) cell during a setting phase of memory operation. For example, such a bias signal may be applied to a PCM cell during read and/or write operations by a memory controller, for example. A bias signal that includes such set-ramp shaping may lead to a desired set pulse in terms of crystallization and overall speed of a PCM, for example. Here, a desired set pulse may achieve a relatively fast effective crystallization of a population of PCM cells. In a particular implementation, a bias signal may comprise a waveform including a nonlinear portion having an initial steep slope that subsequently decreases in magnitude with time. Accordingly, such a nonlinear portion may comprise a concave-upward shape and/or a smooth concave-upward shape. Such a nonlinear portion, of course, may comprise a variety of non-linear shapes and/or configurations, and claimed subject matter is not limited to any particular shape.

In an embodiment, a PCM cell may be reset by melting phase change material by applying a relatively high amplitude, relatively short duration electrical programming pulse or bias signal. In a reset state, an active region of phase change material may comprise an amorphous region that is dome-shaped, disposed adjacent to a heater element in the PCM cell. Crystallized phase change material may surround such an amorphous region. In such a state, a PCM cell may have a relatively high electrical resistance. In a subsequent process, a PCM cell may be set by crystallizing a dome-shaped amorphous region so that a substantially entire region of phase change material may be crystalline. Such a process may involve ramping down a voltage and/or current of a bias signal applied to crystallize the phase change material. In such a state, a PCM cell may have a relatively low electrical resistance. Such a process of crystallizing a dome-shaped amorphous region may be performed relatively quickly in order to benefit operational performance (e.g., speed) of the PCM cell. However, performing such crystallization too quickly may result in non-crystallized amorphous regions and/or imperfections in the phase change material, resulting in a higher-than-desired electrical resistance. In other words, such a crystallization process may involve a ramping-down bias signal that provides enough time to fully crystallize a dome-shaped amorphous region without adversely producing amorphous regions and/or imperfections. Accordingly, a process of determining setting rate for a PCM cell may involve a trade-off between PCM write speed and assuring that a high percentage of the phase change material is crystallized.

In an embodiment, a PCM may comprise a plurality of PCM cells that include a phase change memory. Due to variations in fabrication conditions from lot to lot and/or from region to region on a semiconductor wafer, for example, characteristics and/or physical parameters of such PCM cells may vary. Of course, such variations may result from any of a number of situations. For another example, physical position of a PCM cell in a circuit may affect and/or modify physical parameters of a PCM cell. In particular, capacitance, magnetic and electric fields, and/or heat may contribute to such variations. Accordingly, one portion of PCM cells in a PCM may behave differently from another portion of PCM cells. For example, a rate at which a particular bias signal affects some PCM cells may be different than for other PCM cells. In one implementation, variations in physical and material parameters among PCM cells may be among a number of characteristics leading to a variation in a rate at which a bias signal affects such PCM cells. To take such variation into account, a process of setting a PCM may involve ramping-down a bias signal at a particular rate based, at least in part, on physical characteristics of a first population of PCM cells in a PCM, and ramping-down a bias signal at another particular rate based, at least in part, on physical characteristics of a second population of PCM cells in the PCM, and so on. Here, the term "ramping-down" refers to decreasing a set portion of a bias signal associated with a process of crystallizing an amorphous region of (e.g., dome-shaped) phase change material. Accordingly, ramping-down rate may refer to a slope or rate of decrease of a bias signal, which may comprise a voltage and/or current, as a function of time. Of course, such details of PCM cell variation are merely examples, and claimed subject matter is not so limited.

FIG. 1 is a diagram of a portion of phase change memory 100, according to an embodiment. Such a portion is shown to include two memory cells, each memory cell being in a different memory state for illustrative purposes. A semiconductor substrate 150 may include N-doped regions 155, though other configurations, including the use of P-doped regions for example, may be used. Phase change memory 100 may include word lines 105, bit line 120, and word line contact 110. To represent one memory state, a heater 145 contacting a portion of phase change material 125 may heat to melt a portion 140 of phase change material 125, which may then be cooled relatively quickly to comprise amorphous germanium antimony telluride (GST), for example. Such an amorphous material may be relatively highly resistive, resulting in a high-resistance connection to a bitline contact 120. To represent another memory state, a heater 135 contacting a portion of phase change material 115 may heat to melt a portion of phase change material 115, which may then be cooled relatively slowly to comprise a crystalline or polycrystalline, low-resistance material. Such polycrystalline phase change material 115 may thus lead to a low-resistance connection to contact 120. Of course, details of such a portion of a PCM are merely examples, and claimed subject matter is not so limited.

As indicated above, polycrystalline phase change material 115 may develop one or more imperfections 130, which may comprise non-crystallized amorphous regions, resulting from performing a crystallization process too quickly. Such imperfections 130 may detrimentally increase resistance of a connection to bitline contact 120, leading to malfunctioning of the memory cell. For example, such a failed memory cell may fail to read the binary value represented by the low-resistance state.

Figure 2:
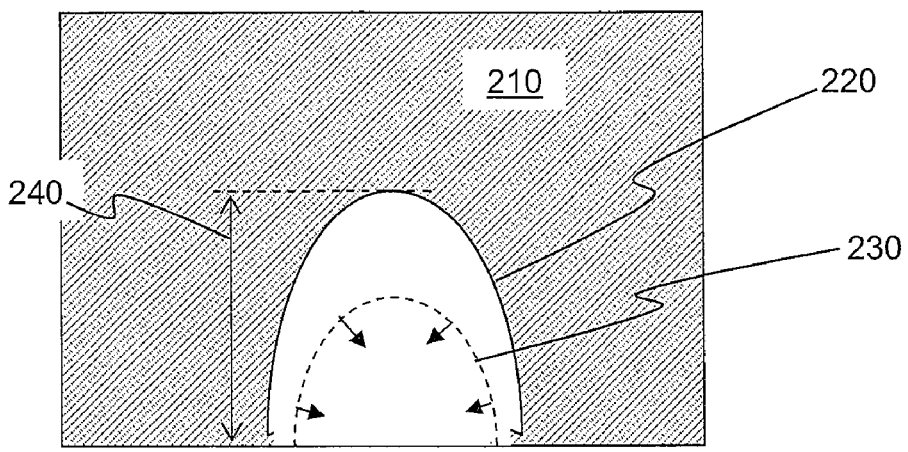
FIG. 2 is a cross-section of a portion of phase change material, according to an embodiment.

FIG. 2 is a cross-section of a portion of polycrystalline phase change material 210, according to an embodiment. Such a portion of phase change material may be similar to phase change material 125 shown in FIG. 1, for example. In an implementation, within a particular time, a dome-shaped amorphous region 220 may shrink to a smaller size portion 230 in response to ramping-down a bias signal to crystallize dome-shaped amorphous region 220, as described above. As such a bias signal continues to ramp-down, smaller size portion 230 may continue to shrink until substantially an entire portion of amorphous region 220 becomes crystallized. A rate of such shrinkage or crystallization may be quantified in terms of a decrease in height 240 of dome-shaped amorphous region 220, for example. For a particular ramp-down rate of a bias signal applied to a plurality of PCM cells, a shrinkage or crystallization rate may vary among PCM cells, as mentioned above. For example, dome-shaped amorphous region 220 included in one PCM cell may crystallize more quickly than that of another PCM cell, even though both PCM cells may experience an identical bias signal rate. Of course, such details of crystallization of phase change material are merely examples, and claimed subject matter is not so limited.

Figure 3:
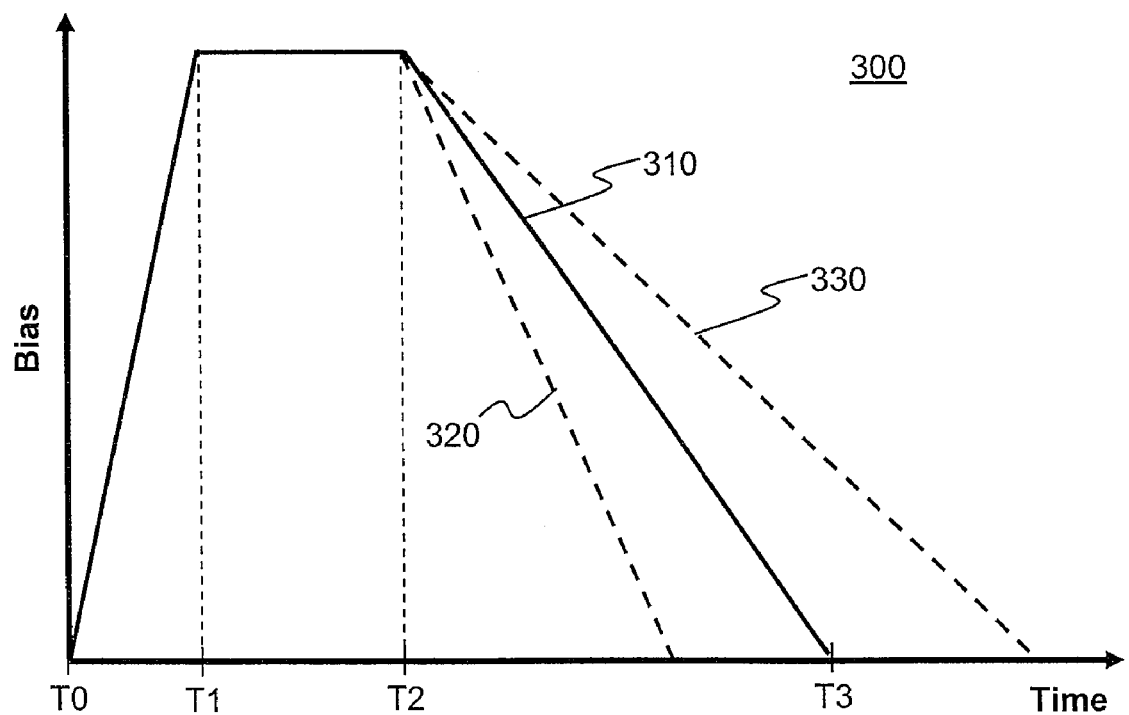
FIG. 3 is a plot of characteristics of a bias signal waveform, according to an embodiment.

FIG. 3 is a plot of characteristics of a bias signal 300 including a set portion 310 plotted against time, according to an embodiment. From time T0 to time T1, bias signal 300 applied to a PCM cell may be ramped-up during a reset process to bring an active volume of a phase change material of the PCM cell to a molten phase. From time T1 to time T2, such an amorphous, resistive phase may comprise a steady state of the active volume of the phase change material while bias signal 300 remains substantially constant. Subsequently, from time T2 to time T3, a set process may include ramping-down bias signal 310 to crystallize the active volume of the phase change material. To achieve fast operational performance, such a set process may include applying a bias signal having a relatively steep ramp-down slope 320 in order to crystallize phase change material at a relatively fast rate. However, as discussed above, if a ramp-down rate of a bias signal is greater than a particular amount, such a rate may lead to imperfections and/or pocket regions of un-crystallized phase change material in a set state of a PCM cell. On the other hand, if a ramp-down rate of a bias signal, such as ramp-down slope 330, is less than a particular amount, such a rate may lead to decreased performance (e.g., speed) of a PCM. Thus, a ramp-down portion of bias signal 310 may be selected to have a slope for a desired operational performance of a PCM cell while achieving substantially complete crystallization of phase change material for a set state of the PCM cell. Here, "desired" is not intended to represent a precise condition, but rather loosely refers to a bias signal set rate that is just slow enough to allow substantially complete crystallization of a phase change material in a memory cell while being fast enough to provide relatively high speed memory performance, for example.

As discussed above, due to variations in fabrication conditions, for example, characteristics and/or physical parameters of PCM cells in a PCM may vary. For example, a particular bias signal may affect some PCM cells differently from other PCM cells. Accordingly, one portion of PCM cells in a PCM may behave differently from another portion of PCM cells in response to an applied bias signal having a particular ramp-down slope. For example, a crystallization process using ramp-down slope 320 may be desired for one portion of PCM cells while being too fast (e.g., leading to imperfections in a phase change material) for another portion of PCM cells. Likewise, a crystallization process using ramp-down slope 330 may be desired for one portion of PCM cells while being slower than necessary (e.g., adversely affecting memory performance speed) for another portion of PCM cells. Accordingly, a medium ramp-down slope, such as that of ramp-down portion of bias signal 310, may lead to a rate of crystallization that is too fast for some PCM cells, too slow for other PCM cells, and desired for yet other PCM cells. Selection of an improved ramp-down slope that may take into consideration such PCM cell variations will be discussed in detail below.

Figure 4:
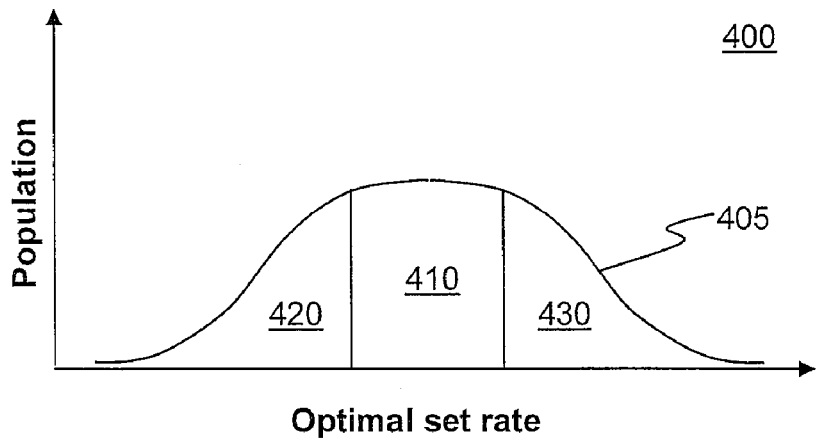
FIG. 4 is a plot showing a distribution of set rates for a population of memory cells in a PCM, according to an embodiment.

FIG. 4 is a plot 400 showing a distribution 405 of desired set rates for a population of memory cells in a PCM, according to an embodiment. Again, "desired" is not intended to represent a precise condition. Accordingly, "desired set rate" loosely refers to a bias signal set rate that is slow enough to allow substantially complete crystallization of a phase change material in a particular PCM cell (or population of like PCM cells) while being fast enough to provide relatively high speed memory performance, for example. As discussed above, a PCM may include PCM cells having variations in a set rate due to variations in fabrication conditions of the PCM cells, for example. For example, as described above, a rate at which a particular bias signal affects some PCM cells may be different than for other PCM cells. To illustrate an example using bias signal 300 in FIG. 3, a process of setting PCM cells 420 may involve ramping-down a bias signal at a particular rate corresponding to ramp-down slope 320; a process of setting PCM cells 430 may involve ramping-down a bias signal at a particular rate corresponding to ramp-down slope 330, and a process of setting PCM cells 410 may involve ramping-down a bias signal at a particular rate corresponding to ramp-down portion of bias signal 310. Of course, such a distribution of PCM cells is merely an example, and claimed subject matter is not so limited.

Figure 5:
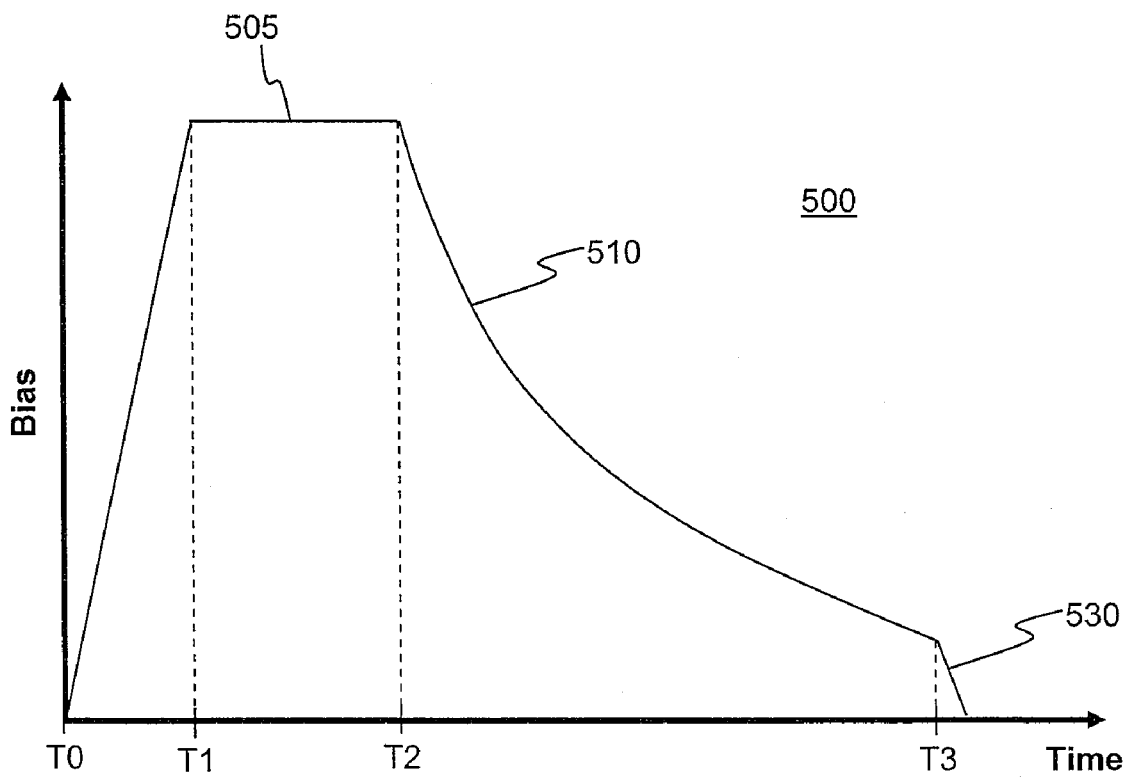
FIG. 5 is a plot of characteristics of a bias signal waveform, according to another embodiment.

FIG. 5 is a schematic view of a bias signal 500 including a set portion 510 plotted against time, according to an embodiment. From time T0 to time T1, bias signal 500 applied to a PCM cell may be ramped-up during a reset process to bring an active volume of a phase change material of the PCM cell to an amorphous, resistive phase. From time T1 to time T2, such an amorphous, resistive phase may comprise a steady state 505 of the active volume of the phase change material while bias signal 500 remains substantially constant. Subsequently, from time T2 to time T3, a set process may include ramping-down bias signal 500 to crystallize the active volume of phase change material. In a particular implementation, bias signal 500 may comprise a nonlinear portion 510 having an initial steep slope that decreases between times T2 and T3. Accordingly, such a nonlinear portion 510 may comprise a concave-upward shape. Nonlinear portion 510, though shown in FIG. 5 having such a concave-upward shape, may comprise a variety of non-linear shapes and/or configurations, and claimed subject matter is not limited to any particular shape.

In an embodiment, applying a ramping-down bias signal comprising nonlinear portion 510 may provide benefits directed to improving the rate at which a population of PCM cells may be crystallized to a set state, compared to applying a linear ramping-down bias signal, for example. In particular, such crystallization may be carried-out substantially without generating imperfections or amorphous regions of phase change material in a final set structure. In one implementation, nonlinear portion 510 of a bias signal comprising a concave-upward shape may be applied to such a population of PCM cells having a distribution of desired set rates, such as that shown in FIG. 4, for example. In such an application, a concave-upward shape may be well-suited for a distribution of desired set rates since a concave-upward shape itself may comprise a distribution of bias signal slopes.

In another implementation, a particular bias signal may be applied to a PCM cell during a set process to crystallize an active region of a phase change material. In such a case, a rate of crystallization during a set process may be linear with respect to a height of a dome-shaped active region of phase change material in the PCM cell. Accordingly, such a dome-shaped active region may be crystallized linearly with time if a bias signal is ramped-down relatively quickly at first and ending up with the slowest ramp toward the end of a set process. Such a bias signal may comprise nonlinear portion 510 comprising a concave-upward shape, for example.

Figure 6:
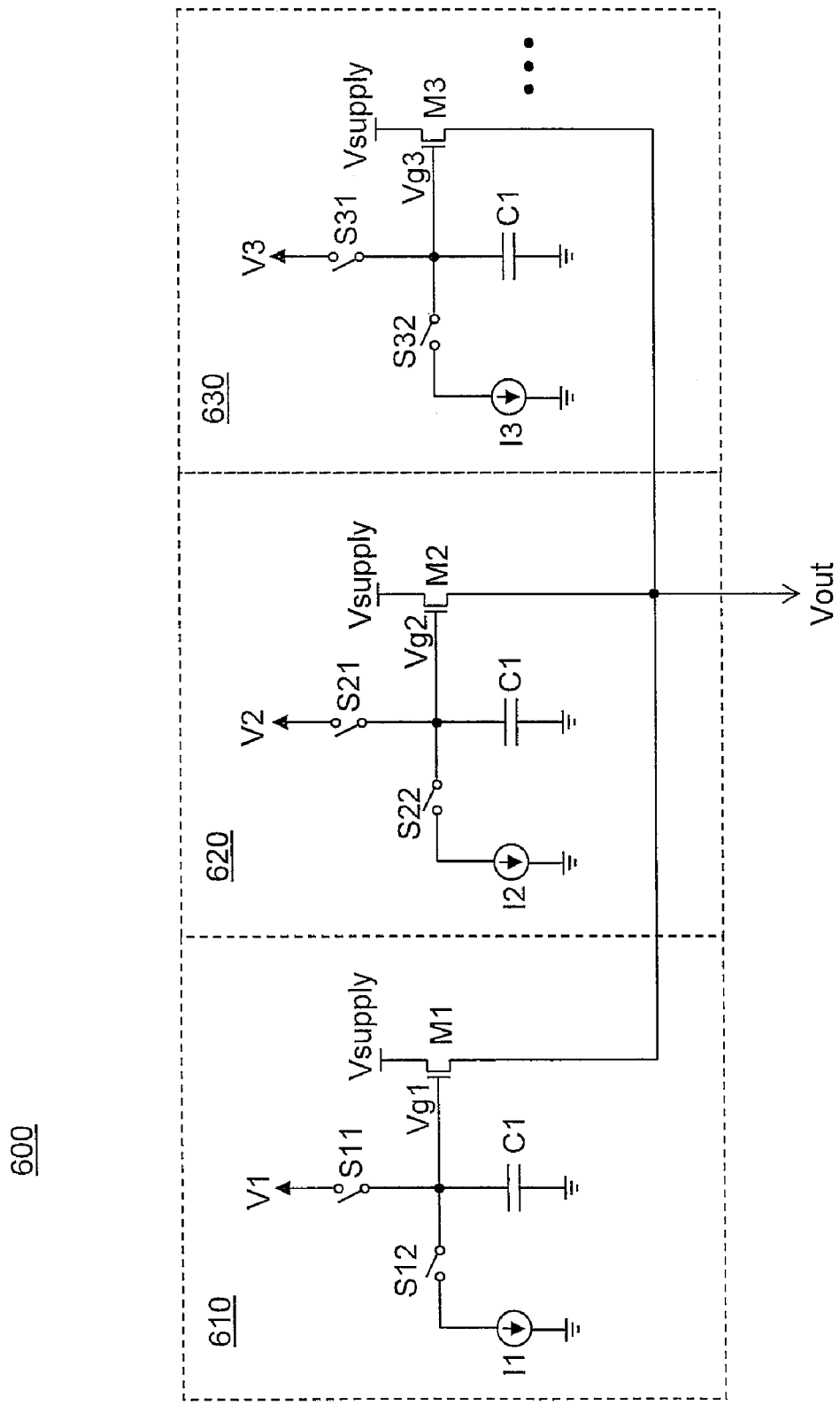
FIG. 6 is a schematic diagram of an electronic circuit to generate a set portion of a bias signal, according to an embodiment.

FIG. 6 is a schematic of an electronic circuit 600 to generate a set portion of a bias signal, according to an embodiment. Circuit 600 comprises merely one of many techniques for generating or producing a set portion of a bias signal having nonlinear characteristics, for example, and claimed subject matter is not limited to any particular technique. Circuit 600 may comprise sub-circuits 610, 620, and 630 that include a transistor M1, M2, and M3, capacitor C1, C2, and C3, a current source I1, I2, and I3, two switches S11, S12, S21, S22, S31, and S32, bias voltage V1, V2, and V3, respectively. Supply voltage Vsup may be provided to sub-circuits 610, 620, and 630. Circuit 600 may generate a voltage Vout to be applied to a PCM during a set process, for example. Vout may be similar to nonlinear portion 520 of a bias signal comprising a concave-upward shape, as shown in FIG. 5, for example. Though circuit 600 is herein described to comprise three sub-circuits 610, 620, and 630, such a waveform generating circuit may comprise any number of sub-circuits. For example, circuit 600 may comprise additional sub-circuits. Accordingly, such details of circuit 600 are merely examples, and claimed subject matter is not so limited.

Figure 7:
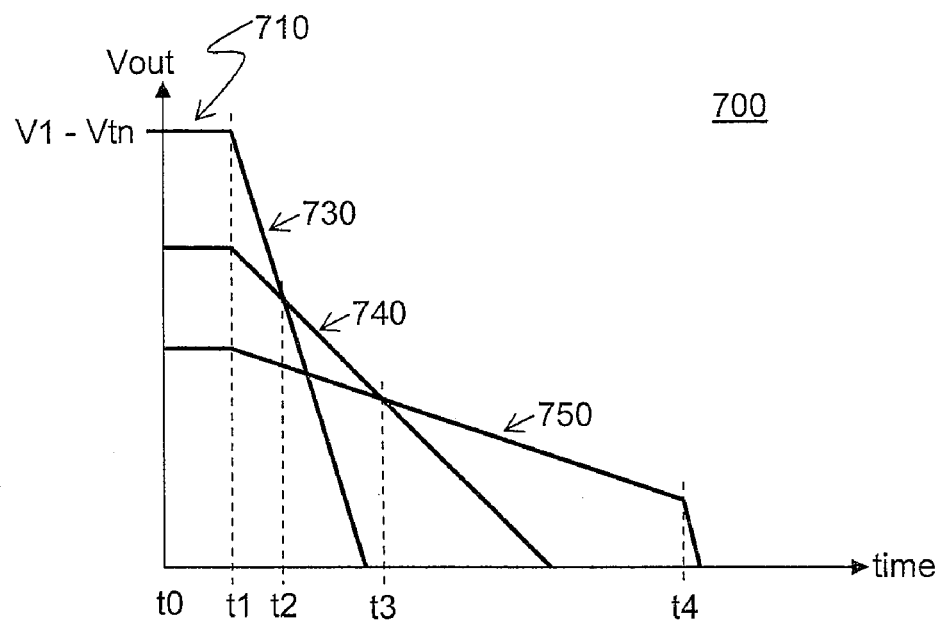
FIG. 7 is a plot of characteristics of components of a set portion of a bias signal, according to an embodiment.
Figure 8:
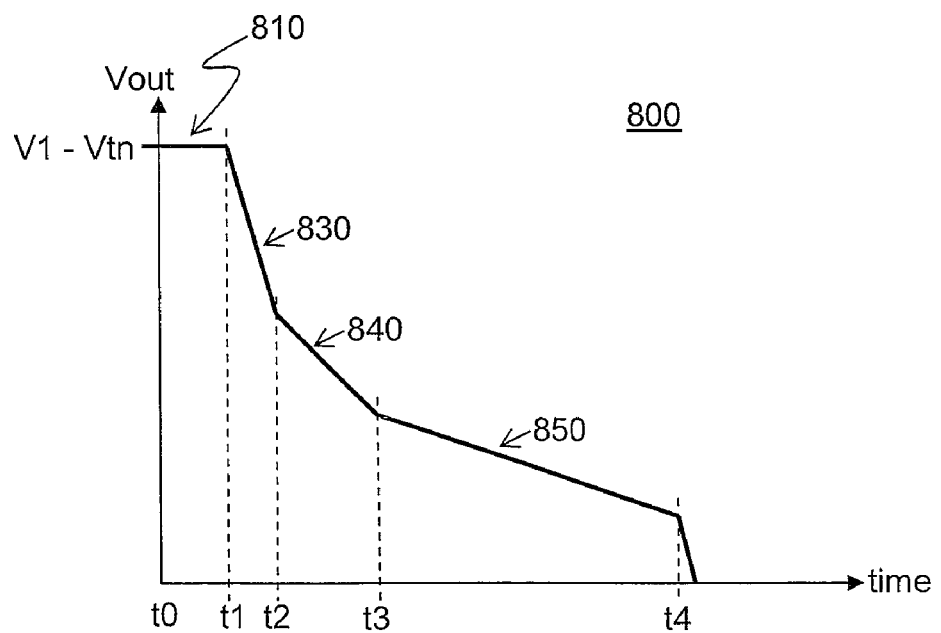
FIG. 8 is a plot of characteristics of a set portion of a bias signal, according to an embodiment.

FIGS. 7 and 8 are plots of characteristics of components of a set portion of a bias signal that may be generated by circuit 600, for example. Such a bias signal may be applied to a PCM cell during read and/or write operations by a memory controller, for example. In particular, waveforms 700 and 800 may comprise Vout plotted as a function of time, according to an embodiment. Returning to FIG. 6, initially, three switches, S11, S21, and S31 may be closed while three switches S12, S22, and S32 may be open. Such a configuration may initialize voltages Vg1, Vg2, and Vg3 to voltages V1, V2, and V3, respectively. V1 may be greater than V2 and V2 may be greater than V3. Such a situation may comprise an initial state 710 and 810 between t0 and t1. Before t1, three switches, S11, S21, and S31 may be opened and capacitors C1, C2, and C3 may store their respective voltages. Then at t1, three switches S12, S22, and S32 may close, connecting three independent current sources I1, I2, and I3 to capacitors C1, C2, and C3. In an implementation, I1 may be greater than I2 and I2 may be greater than I3. Capacitors C1, C2, and C3 may begin to discharge at rates different from one another: Vg1, beginning at a highest voltage V1 may discharge with the fastest slope 730, Vg2 at a slower rate 740, and Vg3 at the slowest rate 750. M1, M2, and M3 may be configured as source-followers, so that Vout may follow approximately one of the gate voltages minus Vtn, wherein Vtn may comprise a threshold voltage of an N-channel MOSFET. The gate that Vout follows may comprise the gate at the highest potential in circuit 600. For example, just after t1 and before t2, since the starting voltages V2 and V3 are less than V1, M1 may determine Vout so that Vout may be approximately Vg1−Vtn. M2 and M3 may be initially off if their source voltages, Vout, is higher than either Vg2−Vtn or Vg3−Vtn, for example. Eventually, at t2, gate voltage of M1 may cross below that of M2. At this point, M2 may turn on while M1 transitions to a sub-threshold state and turns off. Accordingly, Vout may subsequently be determined by Vg2, with its slower ramp (smaller slope). Then, at t3, as Vg2 crosses below Vg3, M2 may turn off, M3 may turn on, and Vout may subsequently follow M3 with a yet slower ramp rate. Of course, such details of circuit 600 are merely examples, and claimed subject matter is not so limited.

FIG. 8 shows a three-part piece-wise-linear output voltage Vout, approximating a concave-up set ramp, for example. Such a piece-wise-linear curve may result from sub-circuits 610, 620, and 630 whose output voltage is individually shown in FIG. 7. Such a piece-wise-linear output voltage may be increasingly continuous (e.g., smooth) upon adding additional sub-circuits in circuit 600, for example. A selection of a number of such sub-circuits may be based, at least in part, on a desired resolution of a resulting output voltage. Though bias signal resolution may increase, added sub-circuits may occupy additional space leading to circuit 600 having an undesirably large size.

In a particular implementation, waveforms 700 and/or 800 may comprise a relatively quick voltage drop beginning at t4, as shown in FIGS. 7 and 8, for example. Though optional, applying a bias voltage having such a quick transition to substantially zero to a PCM cell may provide benefits including improving operational performance of the PCM cell by ending a set process at a bias voltage below which there may be no further programming in the PCM cell. In other words, rather than ramp all the way to zero volts, a set process may stop at approximately 1.3V, for example, below which no further crystallization of a phase change material in a PCM cell may occur.

Though waveforms 700 and/or 800 are herein described to comprise three discrete slopes 830, 840, and 850, such set portions of a bias signal waveform may comprise any number of discrete slope values and/or ranges of continuous slope values. For example, waveform 800 may comprise nonlinear set portion 520 shown in FIG. 5. Accordingly, such details of waveforms 700 and 800 are merely examples, and claimed subject matter is not so limited.

Figure 9:
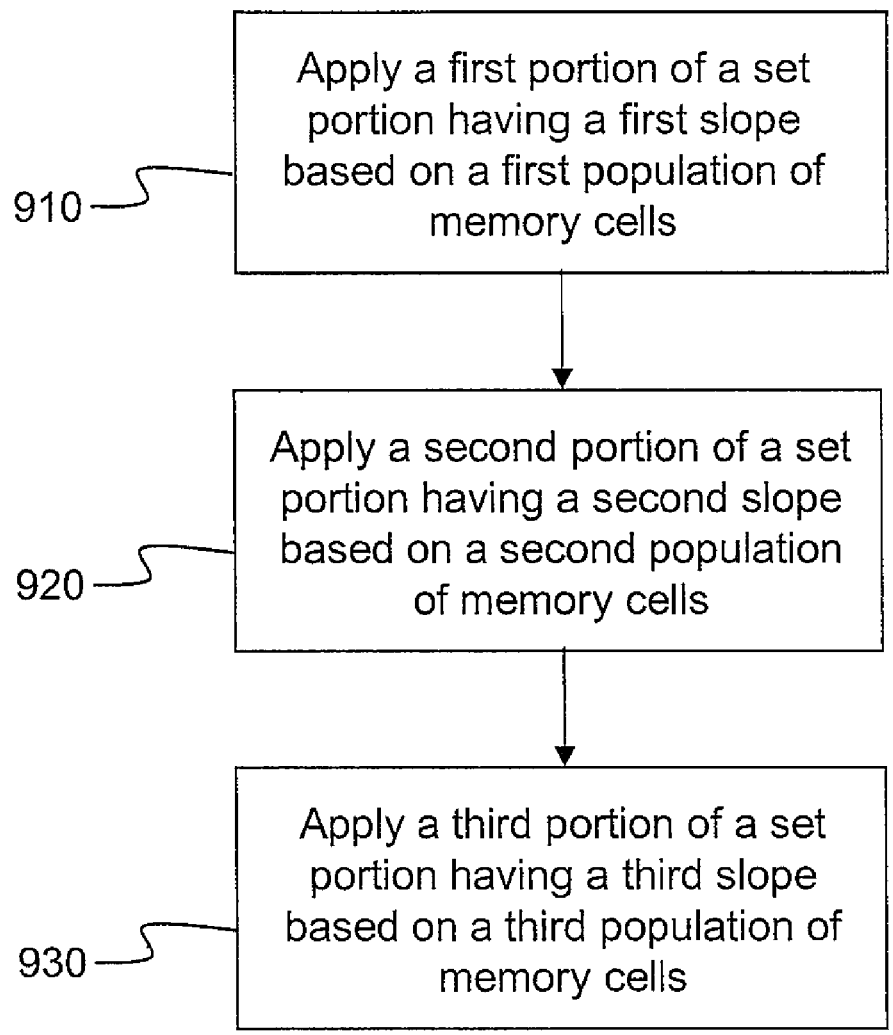
FIG. 9 is a flow diagram of a process of applying a set portion of a bias signal to a memory cell, according to an embodiment.

FIG. 9 is a flow diagram of a process 900 of applying a set portion of a bias signal to a PCM, according to an embodiment. Such a process may involve a PCM comprising a plurality of PCM cells that include a phase change memory. As discussed above, such a plurality of PCM cells may comprise populations of PCM cells having varying crystallization rates in response to a particular ramp-down slope of a bias signal. Such variation may result from variations in fabrication conditions of the PCM cells, for example. Accordingly, one portion of PCM cells in a PCM may behave differently from another portion of PCM cells. At block 910, a first portion of a set portion of a bias signal may be applied to a plurality of PCM cells. Such a first portion may comprise a first slope based, at least in part, on a first population of memory cells having particular crystallization response rates within a first range of values. Such a first slope of bias signal, which may be applied to a PCM for a first duration, may comprise one or more discrete or continuous slope values or a range of slope values. For example, a first slope may comprise first slope 830 shown in FIG. 8. Subsequently, at block 920, a second portion of a set portion of a bias signal may be applied to a plurality of PCM cells. Such a second portion may comprise a second slope based, at least in part, on a second population of memory cells having particular crystallization response rates within a second range of values. Such a second slope of bias signal, which may be applied to a PCM for a second duration, may comprise one or more discrete or continuous slope values or a range of slope values. For example, a second slope may comprise second slope 840 shown in FIG. 8. Next, at block 930, a third portion of a set portion of a bias signal may be applied to a plurality of PCM cells. Such a third portion may comprise a third slope based, at least in part, on a third population of memory cells having particular crystallization response rates within a third range of values. Such a third slope of bias signal, which may be applied to a PCM for a third duration, may comprise one or more discrete or continuous slope values or a range of slope values. For example, a third slope may comprise third slope 850 shown in FIG. 8. Though process 900 is herein described to involve applying three portions of a set portion of a bias signal, any number of portions may be applied to a PCM. For example, process 900 may further include applying subsequent portions of a set portion of a bias signal having additional slopes based, at least in part, on a other populations of memory cells having particular crystallization response rates. Accordingly, such details of process 900 are merely examples, and claimed subject matter is not so limited.

Figure 10:
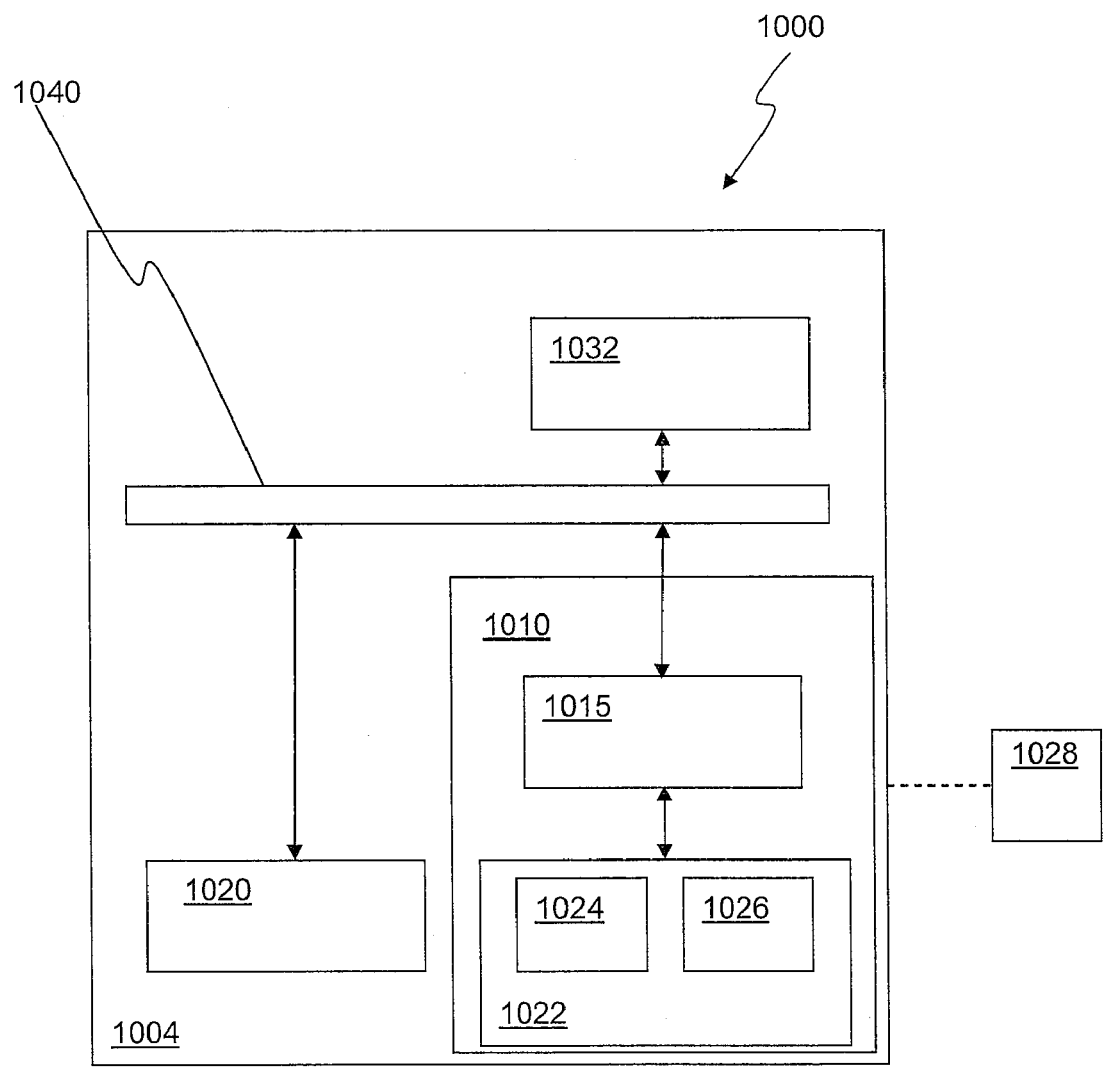
FIG. 10 is a schematic diagram illustrating an exemplary embodiment of a computing system.

FIG. 10 is a schematic diagram illustrating an exemplary embodiment of a computing system 1000 including a memory device 1010. Such a computing device may comprise one or more processors, for example, to execute an application and/or other code. For example, memory device 1010 may comprise a memory that includes PCM 100, shown in FIG. 1. A computing device 1004 may be representative of any device, appliance, or machine that may be configurable to manage memory device 1010. Memory device 1010 may include a memory controller 1015 and a memory 1022. By way of example but not limitation, computing device 1004 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 1000, and the processes and methods as further described herein, may be implemented using or otherwise including hardware, firmware, software, or any combination thereof. Thus, by way of example but not limitation, computing device 1004 may include at least one processing unit 1020 that is operatively coupled to memory 1022 through a bus 1040 and a host or memory controller 1015. Processing unit 1020 is representative of one or more circuits configurable to perforn at least a portion of a data computing procedure or process. By way of example but not limitation, processing unit 1020 may include one or more processors, controllers, microprocessors, microcontrollers, application specific integrated circuits, digital signal processors, programmable logic devices, field programmable gate arrays, and the like, or any combination thereof. Processing unit 1020 may include an operating system configured to communicate with memory controller 1015. Such an operating system may, for example, generate commands to be sent to memory controller 1015 over bus 1040. Such commands may comprise read and/or write commands. In response to a write command, for example, memory controller 1015 may provide a bias signal, such as bias signal 500 comprising a nonlinear portion 520, shown in FIG. 5, for example. In particular, memory controller 1015 may apply a bias signal 500 to an array of PCM cells to place the PCM cells in a set state; crystallize at least a portion of phase change material in the PCM cells by decreasing the bias signal at a first rate based, at least in part, on one or more physical attributes of a first population of the array of PCM cells; and crystallize at least another portion of the phase change material by decreasing the bias signal at a second rate different from the first rate based, at least in part, on one or more physical attributes of a second population of said array of PCM cells.

Memory 1022 is representative of any data storage mechanism. Memory 1022 may include, for example, a primary memory 1024 and/or a secondary memory 1026. Primary memory 1024 may include, for example, a random access memory, read only memory, etc. While illustrated in this example as being separate from processing unit 1020, it should be understood that all or part of primary memory 1024 may be provided within or otherwise co-located/coupled with processing unit 1020.

Secondary memory 1026 may include, for example, the same or similar type of memory as primary memory and/or one or more data storage devices or systems, such as, for example, a disk drive, an optical disc drive, a tape drive, a solid state memory drive, etc. In certain implementations, secondary memory 1026 may be operatively receptive of, or otherwise configurable to couple to, a computer-readable medium 1028. Computer-readable medium 1028 may include, for example, any medium that can carry and/or make accessible data, code, and/or instructions for one or more of the devices in system 1000.

Computing device 1004 may include, for example, an input/output 1032. Input/output 1032 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 1032 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    applying a bias signal pulse to a terminal of one or more word lines or bit lines of a plurality of phase change memory (PCM) cells comprising a phase change material to set said PCM cells in response to a write command;
    crystallizing at least a portion of said phase change material by decreasing a voltage of said bias signal pulse at a first range of rates based, at least in part, on one or more physical attributes of a first population of said plurality of PCM cells; and
    crystallizing at least another portion of said phase change material by decreasing a voltage of said bias signal pulse at a second range of rates different from said first range of rates based, at least in part, on one or more physical attributes of a second population of said plurality of PCM cells.

2. The method of claim 1, further comprising:
    crystallizing at least an additional portion of said phase change material by decreasing a voltage of said bias signal pulse at a third range of rates different from said first and second ranges of rates based, at least in part, on one or more physical attributes of a third population of said plurality of PCM cells.

3. The method of claim 1, wherein said bias signal pulse comprises a single pulse of a voltage and/or current signal.

4. The method of claim 1, wherein said bias signal pulse comprises a smooth concave-up set ramp.

5. The method of claim 1, wherein said one or more physical attributes comprise memory cell electrical characteristics.

6. The method of claim 1, wherein said phase-change material comprises germanium antimony telluride (GST).

7. A non-volatile memory device comprising:
    an array of phase change memory (PCM) cells comprising a phase change material; and
    a controller to:
        apply a bias signal pulse to a terminal of one or more word lines or bit lines of said array of PCM cells to set said PCM cells in response to a write command;
        crystallize at least a portion of said phase change material by decreasing a voltage of said bias signal pulse at a first range of rates based, at least in part, on one or more physical attributes of a first population of said array of PCM cells; and
        crystallize at least another portion of said phase change material by decreasing a voltage of said bias signal pulse at a second range of rates different from said first range of rates based, at least in part, on one or more physical attributes of a second population of said array of PCM cells.

8. The non-volatile memory device of claim 7, further comprising:
    a ramp-generating circuit to provide said bias signal pulse at said first range of rates for a first duration and to provide said bias signal pulse at said second range of rates for a second duration.

9. The non-volatile memory device of claim 7, wherein said controller is further adapted to crystallize at least an additional portion of said phase change material by decreasing a voltage of said bias signal pulse at a third range of rates different from said first and second ranges of rates based, at least in part, on one or more physical attributes of a third population of said plurality of PCM cells.

10. The non-volatile memory device of claim 9, further comprising:
    a ramp-generating circuit to provide said bias signal pulse at said first range of rates for a first duration, to provide said bias signal pulse at said second range of rates for a second duration, and to provide said bias signal pulse at said third range of rates for a third duration.

11. The non-volatile memory device of claim 7, wherein said bias signal pulse comprises a smooth concave-up set ramp.

12. The non-volatile memory device of claim 7, wherein said one or more physical attributes comprise memory cell electrical characteristics.

13. The non-volatile memory device of claim 7, wherein said phase-change material comprises germanium antimony telluride (GST).

14. A system comprising:
    a memory device comprising an array of phase change memory (PCM) cells comprising a phase change material, said memory device further comprising a memory controller to:

apply a bias signal pulse to a terminal of one or more word lines or bit lines of said array of PCM cells to set said PCM cells in response to a write command;

crystallize at least a portion of said phase change material by decreasing a voltage of said bias signal pulse at a first range of rates based, at least in part, on one or more physical attributes of a first population of said array of PCM cells; and crystallize at least another portion of said phase change material by decreasing a voltage of said bias signal pulse at a second range of rates different from said first range of rates based, at least in part, on one or more physical attributes of a second population of said array of PCM cells; and a processor to host one or more applications and to initiate said write command to said memory controller to provide access to said memory cells in said memory cell array.

15. The system of claim 14, further comprising:
a ramp-generating circuit to provide said bias signal pulse at said first range of rates for a first duration and to provide said bias signal pulse at said second range of rates for a second duration.

16. The system of claim 14, wherein said controller is further adapted to crystallize at least an additional portion of said phase change material by decreasing a voltage of said bias signal pulse at a third range of rates different from said first and second range of rates based, at least in part, on one or more physical attributes of a third population of said plurality of PCM cells.

17. The system of claim 16, further comprising:
a ramp-generating circuit to provide said bias signal pulse at said first range of rates for a first duration, to provide said bias signal pulse at said second range of rates for a second duration, and to provide said bias signal pulse at said third range of rates for a third duration.

18. The system of claim 14, wherein said bias signal pulse comprises a single substantially constant steady state portion of a voltage and/or current signal.

19. The system of claim 14, wherein said one or more physical attributes comprise memory cell electrical characteristics.

20. The system of claim 14, wherein said phase-change material comprises germanium antimony telluride (GST).

* * * * *